United States Patent [19]

Kamon

[11] Patent Number: 5,251,067
[45] Date of Patent: Oct. 5, 1993

[54] FLY-EYE LENS DEVICE AND LIGHTING SYSTEM INCLUDING SAME

[75] Inventor: Kazuya Kamon, Itami, Japan

[73] Assignee: Mitsubishi Denki Kabushiki Kaisha, Tokyo, Japan

[21] Appl. No.: 788,109

[22] Filed: Nov. 5, 1991

[30] Foreign Application Priority Data

Jan. 8, 1991 [JP] Japan ............................ 3-000465

[51] Int. Cl.$^5$ ............... G02B 3/08; G02B 27/12; F21V 5/04; G03B 27/54
[52] U.S. Cl. ............................ 359/628; 359/619; 359/741; 355/53; 355/67; 362/268; 362/332; 362/336
[58] Field of Search ............... 362/326, 332, 335, 336, 362/268; 359/619, 741, 743, 623, 628; 355/67, 53

[56] References Cited

U.S. PATENT DOCUMENTS

| | | | |
|---|---|---|---|
| 3,425,056 | 1/1969 | Dawson | 362/336 |
| 4,619,508 | 10/1986 | Shibuya et al. | 362/268 |
| 4,769,750 | 9/1988 | Matsumoto et al. | 359/628 |
| 5,153,773 | 10/1992 | Muraki et al. | 359/619 |

OTHER PUBLICATIONS

Hough, William Simpson, Excerpt from Canadian Patent No. 179,064 "Lamp Mechanism" Sep. 4, 1917.

*Primary Examiner*—Bruce Y. Arnold
*Assistant Examiner*—David R. Parsons
*Attorney, Agent, or Firm*—Oblon, Spivak, McClelland, Maier & Neustadt

[57] ABSTRACT

In a fly-eye lens device according to the present invention, a fly-eye lens supported by supporting means is formed by two-dimensionally arranging plural types of fly-eye constituent lenses of unequal size. In the arrangement, the plural types of the fly-eye constituent lenses are disposed in order of ascending size from the center of the fly-eye lens toward the periphery thereof. A lighting system according to the present invention is equipped with the fly-eye constituent lenses. In the lighting system, light emanating from a light source passes through first optical means and impinges on the fly-eye constituent lenses. The light, after passing through a stop, is directed through second optical means to an object to be illuminated. The present invention can ensure the predetermined number of fly-eye constituent lenses which contribute to uniformity of illumination, and achieve uniform illumination at low cost.

7 Claims, 7 Drawing Sheets

FLY-EYE LENS DEVICE AND LIGHTING SYSTEM INCLUDING SAME

BACKGROUND OF THE INVENTION

1. Field of the Invention

The present invention relates to a fly-eye lens device incorporated in a projection printing and the like for use in a process of manufacturing LSIs and a lighting system including the fly-eye lens device.

2. Description of the Background Art

Figure 6:
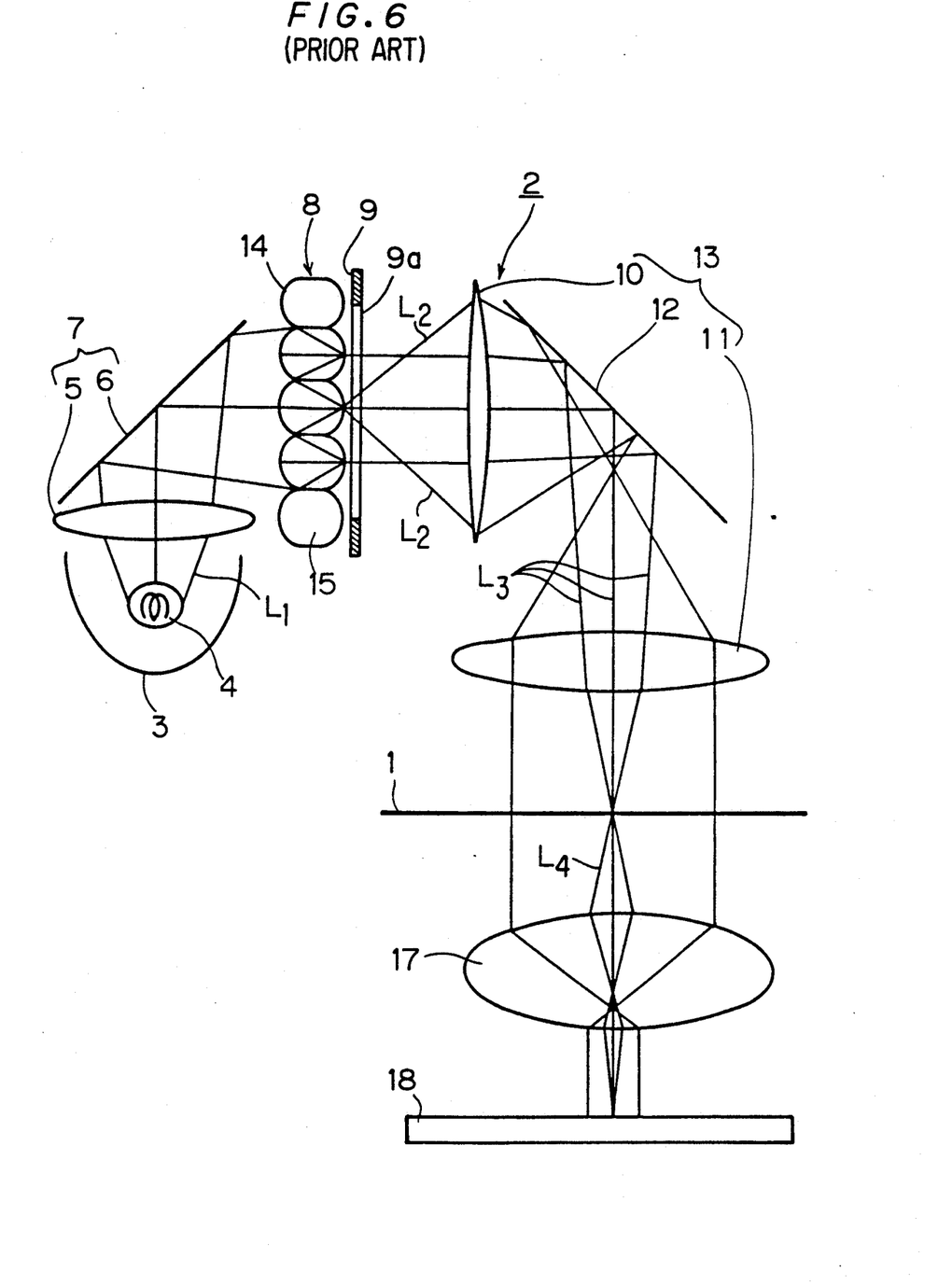
FIG. 6 is a schematic structural view of a projection printing equipped with a lighting system including a conventional fly-eye lens device.
Figure 7:
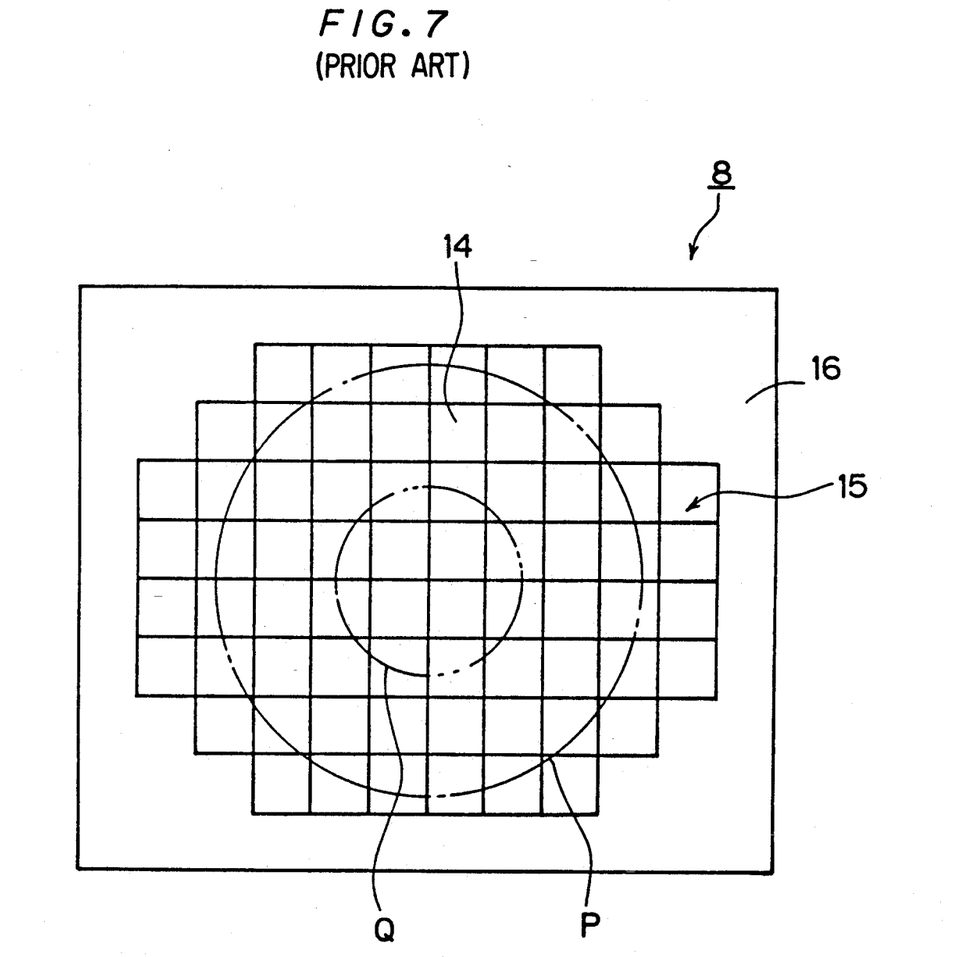
FIG. 7 is a front elevation of the conventional fly-eye lens device.

FIG. 6 is a schematic structural view of a projection printing which has been conventionally used in a photolithography process. FIG. 7 is a front elevation of a conventional fly-eye lens device incorporated in the projection printing.

As shown in FIG. 6, the projection printing comprises a lighting system 2 for uniformly illuminating a photomask 1. The lighting system 2 includes a light source 4 having a reflector 3; first optical means 7 composed of a lens 5 and a mirror 6; a fly-eye lens device 8; a stop 9; and second optical means 13 composed of lenses 10, 11 and a mirror 12.

The fly-eye lens device 8, as shown in FIG. 7, comprises a fly-eye lens 15 formed by two-dimensionally arranging a plurality of fly-eye constituent lenses 14 of square cross section and of the same size, and supporting means 16 such as an outer frame for supporting the fly-eye lens 15. The fly-eye lens device 8 is disposed such that the center of the fly-eye lens 15 coincides with that of an aperture 9a of the stop 9. A dashed-and-dotted circle P in FIG. 7 indicates the position of the aperture 9a of the stop 9 relative to the fly-eye lens device 8. For convenience, fewer fly-eye constituent lenses 14 are illustrated in FIG. 6 than the actual ones, and the illustration of the supporting means 16 is omitted in FIG. 6.

In FIG. 6, reference numeral 17 designates a projection lens, and 18 designates a semiconductor wafer.

In the projection printing, light L1 emitted from the light source 4, after passing through the lens 5 and reflected from the mirror 6, is introduced to the fly-eye lens device 8. The light impinging on the respective fly-eye constituent lenses 14 of the fly-eye lens device 8 passes through the aperture 9a of the stop 9, the lens 10, the mirror 12 and the lens 11 to illuminate the whole surface of the photomask 1. In FIG. 6, light L2 emanating from one of the fly-eye constituent lenses 14 which is disposed in the center thereof illuminates the whole surface of the photomask 1 by means of the second optical means 13. The lights emanating from the other fly-eye constituent lenses 14 similarly pass through the second optical means 13 to illuminate the whole surface of the photomask 1. Even when the light L1 emitted from the light source 4 has non-uniform light intensity distribution, the lights L2 emitted from the respective fly-eye constituent lenses 14 overlap each other to be averaged on the photomask 1, thereby uniform illumination being achieved thereon. For reference, L3 designates light converged on the photomask 1 by means of the second optical means 13 after emitted from the respective fly-eye constituent lenses 14.

Light L4 which has passed through the photomask 1 is directed through the projection lens 17 and converged on a resist film on the semiconductor wafer 18, so that a predetermined mask pattern is transferred thereto.

This type of projection printing, in some cases, employs the photomask 1 using what is called a phase shift method in order to improve the transfer accuracy of the mask pattern. In this case, when the size of the aperture 9a of the stop 9 is decreased, the coherence a of the light passing through the aperture 9a is increased, and resultingly a preferable contrast image as a mask pattern is expected. However, in the conventional projection printing, all of the fly-eye constituent lenses 14 of the fly-eye lens device 8 are of the same size (for example, the side of the square cross section of the fly-eye constituent lenses 14 is 5 mm in length). When the size of the aperture 9a of the stop 9 is decreased, the number of fly-eye constituent lenses 14 which contribute to the uniform illumination is decreased. As a result, there has been a problem that non-uniform illuminance distribution on the photomask 1 causes the transfer accuracy of the mask pattern to deteriorate.

This problem is described in more detail below. It is commonly known that the coherence a is suitably 0.3 where the phase shift method is employed. In order to achieve the coherence $\sigma$ of 0.3 in the above-mentioned projection printing, the aperture 9a of the stop 9, for example, as shown by the two-dot chain circle Q of FIG. 7, must be smaller-sized than the conventional one (shown by the dashed-and-dotted circle P of FIG. 7). As a result, the number of fly-eye constituent lenses 14 which contribute to the uniform illumination is remarkably decreased (for example, it is reduced to approximately four in the example of FIG. 7). The illuminance distribution on the photomask 1 becomes non-uniform.

To solve the above-mentioned problem, it can be considered to form the fly-eye lens 15 with small-sized fly-eye constituent lenses 14. However, a large number of fly-eye constituent lenses 14 are required therefor. In general, the difficulty comes in processing and assembling a small-sized fly-eye constituent lens 14. It is not only difficult but also costly in terms of fabrication to form the fly-eye lens 15 only with the small-sized fly-eye constituent lenses 14.

SUMMARY OF THE INVENTION

The present invention is directed to a fly-eye lens device incorporated in a projection printing and the like and a lighting system including the fly-eye lens device.

In a first aspect of the present invention, a fly-eye lens device comprises a fly-eye lens formed by two-dimensionally arranging plural types of fly-eye constituent lenses of unequal size and supporting means for supporting the fly-eye lens, wherein the plural types of the fly-eye constituent lenses are disposed in order of ascending size from the center of the fly-eye lens toward the periphery thereof.

In a second aspect of the present invention, a lighting system for uniformly illuminating an object comprises a light source; a fly-eye lens device; first optical means for introducing light emanating from the light source to the fly-eye lens device; a stop disposed on a light-emission side of the fly-eye lens device; and second optical means for introducing light emanating from the fly-eye lens device and passing through the stop to the object, wherein the fly-eye lens device comprises a fly-eye lens formed by two-dimensionally arranging plural types of fly-eye constituent lenses of unequal size and supporting means for supporting the fly-eye lens, the plural types of the fly-eye constituent lenses being disposed in order of ascending size from the center of the fly-eye lens toward the periphery thereof.

Accordingly, a primary object of the present invention is to provide a fly-eye lens device capable of achieving uniform illumination at low cost when the size of an aperture of a stop is set to be small.

Another object of the present invention is to provide a lighting system capable of uniformly illuminating an object by means of the fly-eye lens device.

According to the fly-eye lens device of the present invention, the plural types of the fly-eye constituent lenses are disposed in order of ascending size from the center of the fly-eye lens toward the periphery thereof. Therefore, even when the aperture size of the stop is set to be small, the predetermined number of fly-eye constituent lenses which are within an area corresponding to the aperture can be ensured, and uniform illumination can be achieved.

According to the lighting system of the present invention, since the fly-eye constituent lenses having the above-mentioned structure are employed, the object can be uniformly illuminated even when the aperture size of the stop is set to be small.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
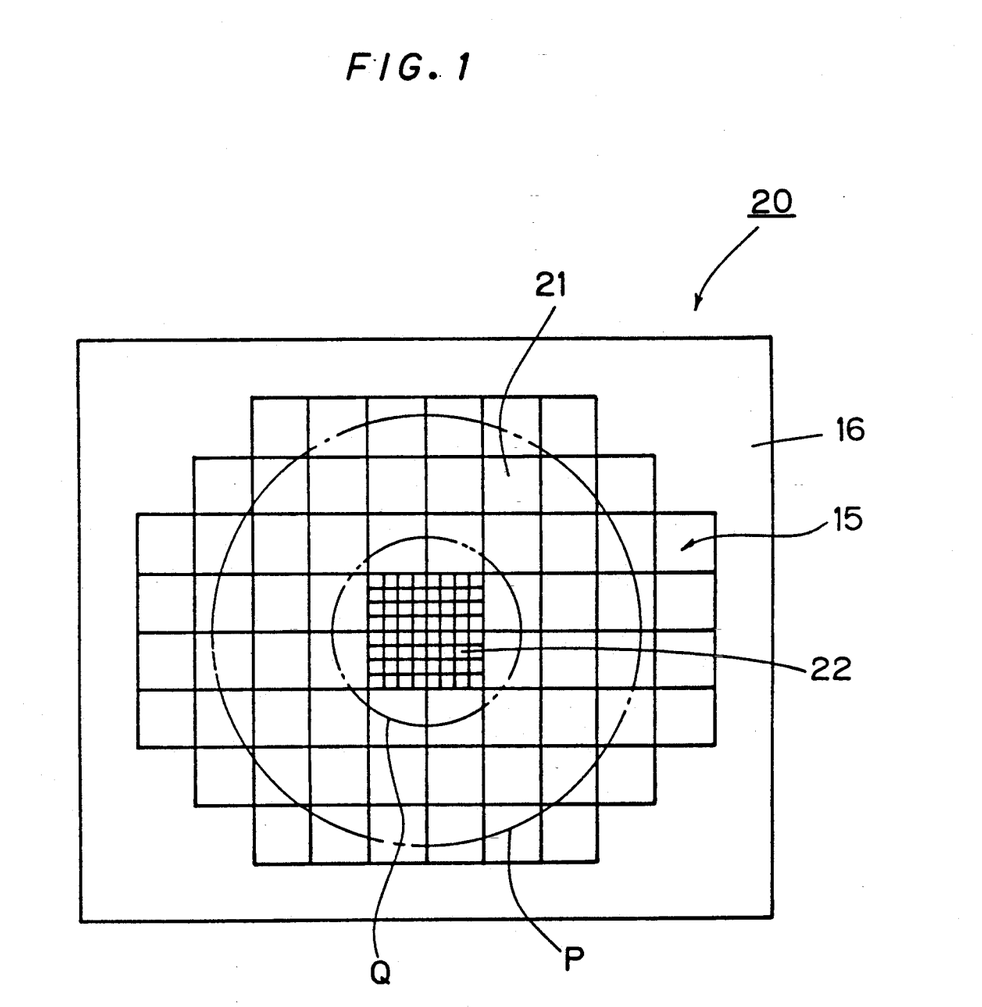
FIG. 1 is a front elevation of a fly-eye lens device according to a first preferred embodiment of the present invention.

FIG. 1 is a front elevation of a fly-eye lens device according to a first preferred embodiment of the present invention.

As shown in FIG. 1, a fly-eye lens device 20 comprises supporting means 16 and a fly-eye lens 15. The supporting means 16 supports the fly-eye lens 15. The fly-eye lens 15 includes two types of fly-eye constituent lenses 21 and 22 of unequal size. Fly-eye constituent lenses 21 of a first type have the structure similar to the fly-eye constituent lenses 14 of FIG. 7, and the side of the square cross section thereof is, for example, 5 mm in length. Fly-eye constituent lenses 22 of a second type are of square cross section, and the side thereof is $\frac{1}{4}$ times as long as that of the square cross section of the fly-eye constituent lenses 21. The fly-eye constituent lenses 22 are disposed in the center of the fly-eye lens 15 in an 8×8 square matrix. The fly-eye constituent lenses 21 are disposed around the fly-eye constituent lenses 22 in a surrounding manner.

Figure 2:
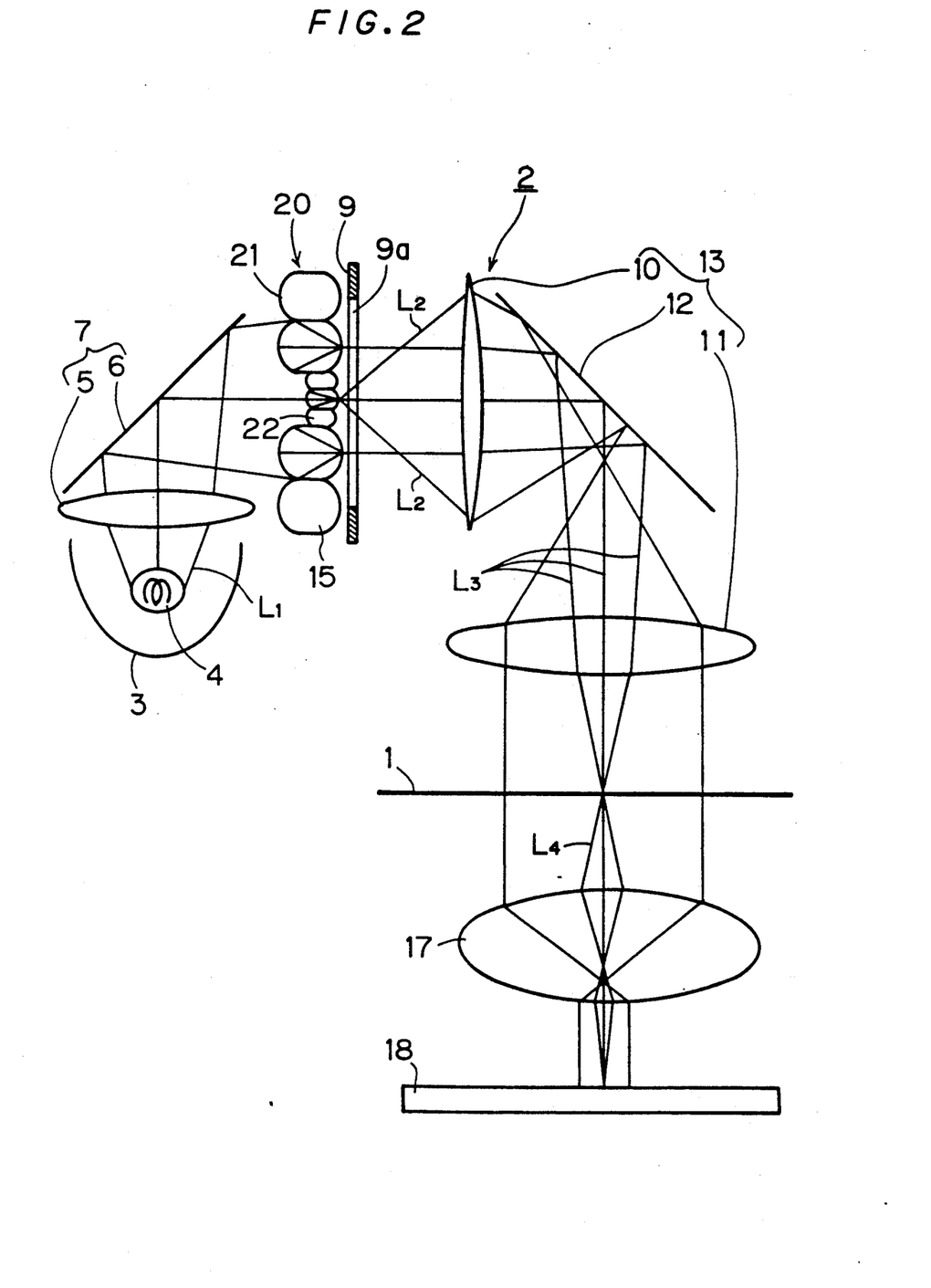
FIG. 2 is a schematic structural view of a projection printing equipped with a lighting system including the fly-eye lens device of FIG. 1.

FIG. 2 is a schematic structural view of a projection printing equipped with a lighting system 2 including the fly-eye lens device 20. For convenience, fewer fly-eye constituent lenses 21 and 22 of the fly-eye lens device 20 are illustrated in FIG. 2 than the actual ones, respectively, and the illustration of the supporting means 16 is omitted in FIG. 2.

The side of the square cross section of the fly-eye constituent lenses 22 is $\frac{1}{4}$ times as long as that of the square cross section of the fly-eye constituent lenses 21. Accordingly, the length of the respective fly-eye constituent lenses 22 in the optical axial direction is $\frac{1}{4}$ times that of the respective fly-eye constituent lenses 21. Each of the fly-eye constituent lenses 22 is designed to converge the incident light from one surface thereof on the other surface accurately.

The structure of the lighting system 2 and others in the first preferred embodiment of the present invention is similar to that in the prior art. That is, the lighting system 2 according to the present invention further comprises a light source 4 having a reflector 3; first optical means 7 composed of a lens 5 and a mirror 6; a stop 9; and second optical means 13 composed of lenses 10, 11 and a mirror 12. The center of the fly-eye lens 15 of the fly-eye lens device 20 is designed to coincide with that of an aperture 9a of the stop 9, similarly to the prior art.

In the projection printing, light L1 emitted from the light source 4, after passing through the lens 5 and reflected from the mirror 6, impinges on the respective fly-eye constituent lenses 21 and 22 of the fly-eye lens device 20. The light impinging on the fly-eye constituent lenses 21 and 22 passes through the aperture 9a of the stop 9, the lens 10, the mirror 12 and the lens 11 to illuminate the whole surface of a photomask 1.

When the size of the aperture 9a of the stop 9 is large as indicated by the dashed-and-dotted circle P of FIG. 1 (at a coherence $\sigma$ of 0.5) similarly to the prior art, a large number of fly-eye constituent lenses 21 and 22 are within an area corresponding to the aperture 9a. The lights emanating from the corresponding fly-eye constituent lenses 21 and 22 pass through the aperture 9a and overlap each other on the photomask 1, thereby uniform illumination being achieved.

Even when the size of the aperture 9a of the stop 9 is small, for example, as indicated by the two-dot chain circle Q of FIG. 1 (at a coherence $\sigma$ of 0.3) in consideration for the phase shift method, at least sixty-four fly-eye constituent lenses 22 are within the area corresponding to the aperture 9a. In the prior art of FIG. 7, only four fly-eye constituent lenses 14 are within the area corresponding to the aperture 9a. The number of fly-eye constituent lenses which contribute to the uniform illumination is, as a result, increased by sixty in comparison with the prior art. The uniform illuminance distribution on the photomask 1 can be achieved also in the case of the small-sized aperture.

In the first preferred embodiment of the present invention, the smaller fly-eye constituent lenses 22 are disposed only in the center of the fly-eye lens 15, while the larger fly-eye constituent lenses 21 which are similar to the fly-eye constituent lenses 14 of the prior art are disposed around the smaller fly-eye constituent lenses 22. The fly-eye lens device 20 having such a structure can be fabricated easily at low cost in comparison with the structure of the fly-eye lens 15 formed with only small-sized fly-eye constituent lenses 22.

The side of the square cross section of the fly-eye constituent lenses 22 is ¼ times as long as that of the square cross section of the fly-eye constituent lenses 21. Therefore, both types of the fly-eye constituent lenses 21 and 22 can be arranged two-dimensionally in close contact with each other without a gap therebetween.

In the first preferred embodiment, the side of the square cross section of the fly-eye constituent lenses 22 is set to ¼ times as long as that of the square cross section of the fly-eye constituent lenses 21. However, in order to arrange two-dimensionally both types of the fly-eye constituent lenses 21 and 22 in close contact with each other without a gap therebetween, the side of the square cross section of the fly-eye constituent lenses 22 should be set to 1/n times as long as that of the square cross section of the fly-eye constituent lenses 21 (where n is an integer larger than 1).

Figure 3:
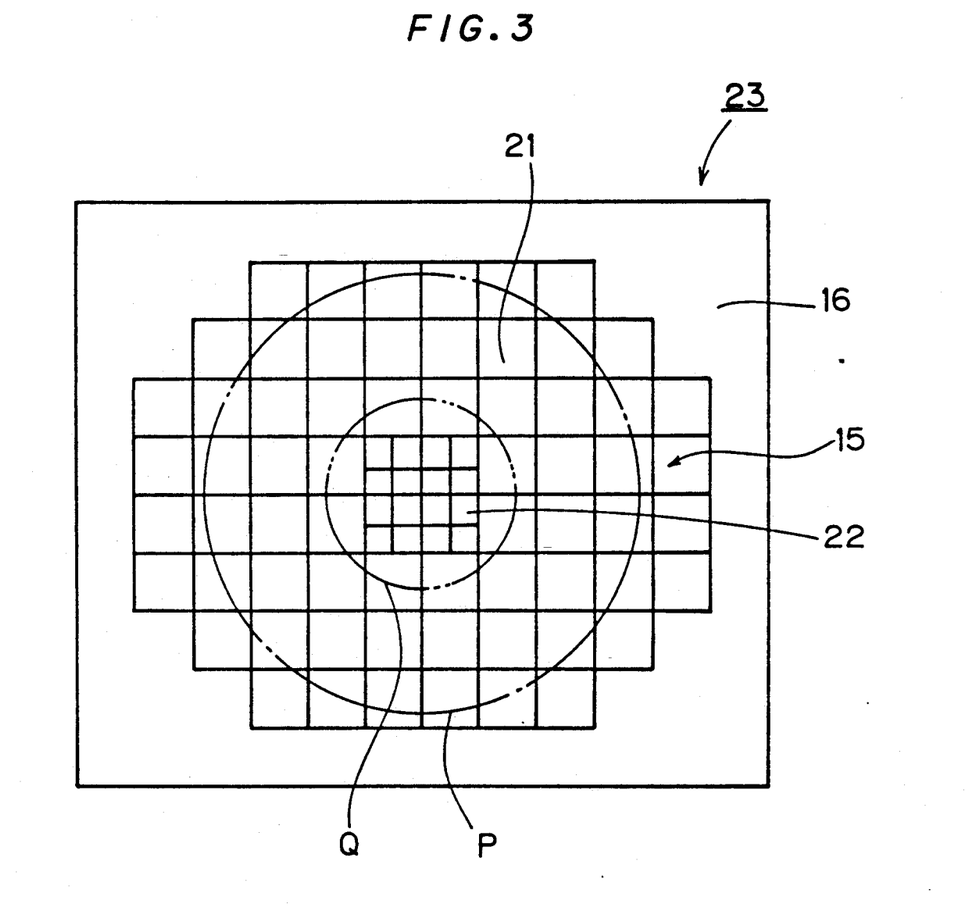
FIG. 3 is a front elevation of the fly-eye lens device according to a second preferred embodiment of the present invention.

FIG. 3 illustrates a fly-eye lens device 23 according to a second preferred embodiment of the present invention. The side of the square cross section of the fly-eye constituent lenses 22 is ½ times as long as that of the square cross section of the fly-eye constituent lenses 21. The fly-eye constituent lenses 22 are arranged in the center of the fly-eye lens 15 in a 4×4 matrix.

Figure 4:
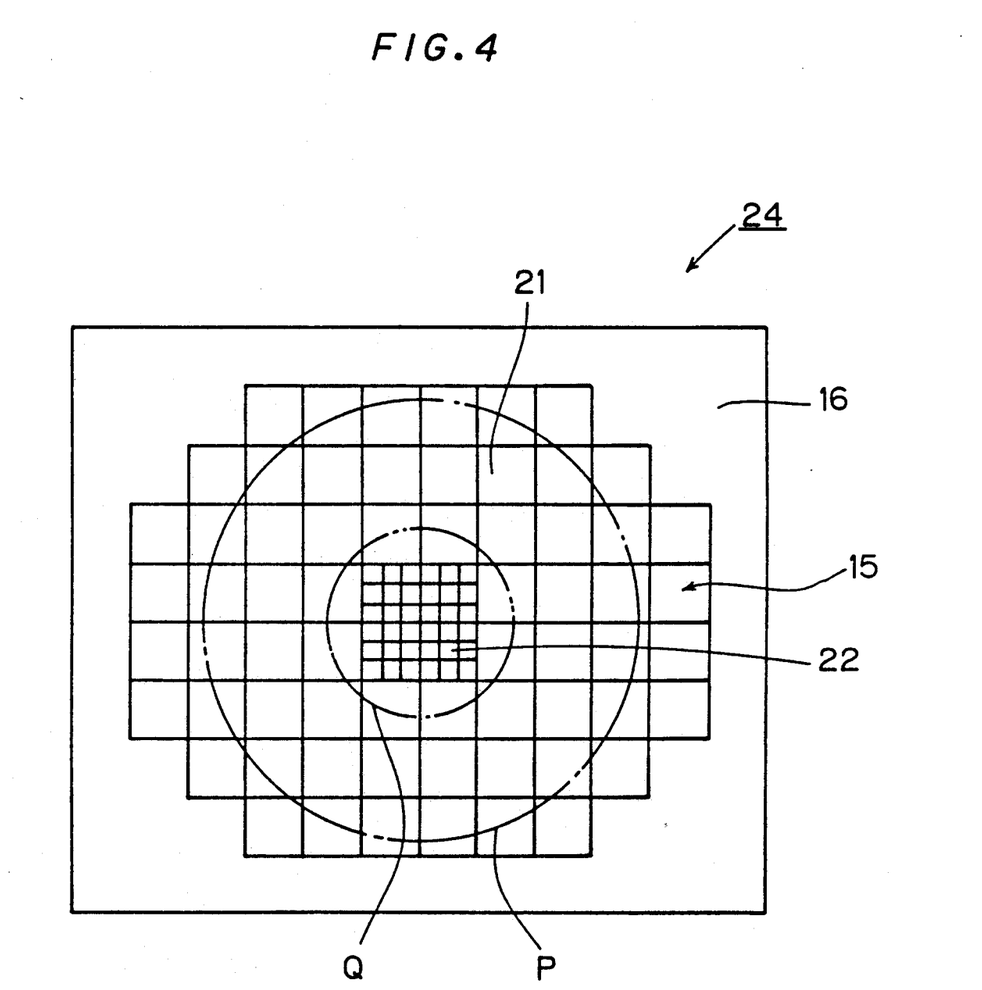
FIG. 4 is a front elevation of the fly-eye lens device according to a third preferred embodiment of the present invention.

FIG. 4 illustrates a fly-eye lens device 24 according to a third preferred embodiment of the present invention. The side of the square cross section of the fly-eye constituent lenses 22 is ⅓ times as long as that of the square cross section of the fly-eye constituent lenses 21. The fly-eye constituent lenses 22 are arranged in the center of the fly-eye lens 15 in a 6×6 matrix. The fly-eye lens devices 23 and 24, when incorporated in the lighting system 2 in place of the fly-eye lens device 20 of the first preferred embodiment, have the effect similar to that of the first preferred embodiment.

Figure 5:
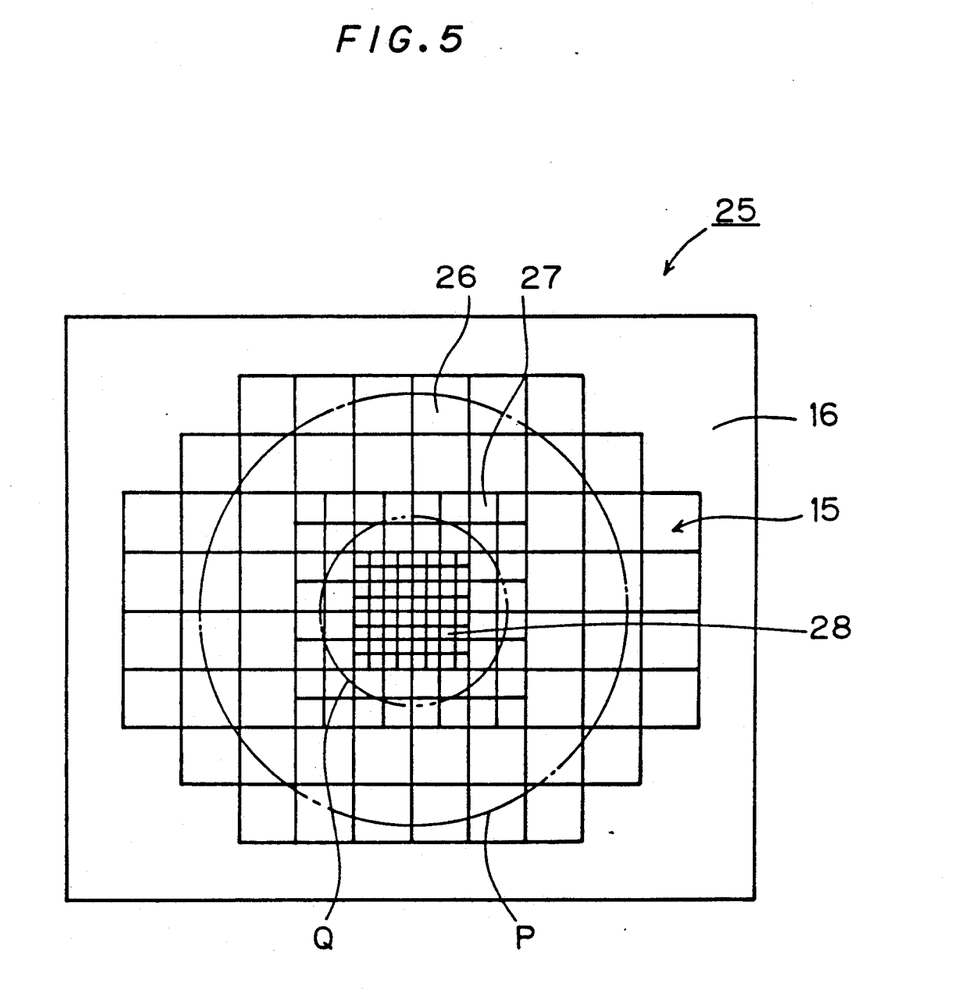
FIG. 5 is a front elevation of the fly-eye lens device according to a fourth preferred embodiment of the present invention.

FIG. 5 is a front elevation of a fly-eye lens device 25 according to a fourth preferred embodiment of the present invention.

In the fly-eye lens device 25, the fly-eye lens 15 comprises three types of fly-eye constituent lenses 26, 27 and 28 of unequal size, as shown in FIG. 5. The structure of the fly-eye constituent lenses 26 of a first type is similar to that of the fly-eye constituent lenses 14 of FIG. 7, and the side of the square cross section of the fly-eye constituent lenses 26 is, for example, 5 mm in length. The fly-eye constituent lenses 27 of a second type are of square cross section, and the side thereof is ½ times as long as that of the first type fly-eye constituent lenses 26. The fly-eye constituent lenses 28 of a third type are of square cross section, and the side thereof is ¼ times as long as that of the first type fly-eye constituent lenses 26. The third type fly-eye constituent lenses 28 are arranged in the center of the fly-eye lens 15 in an 8×8 square matrix. The second type fly-eye constituent lenses 27 are arranged around the third type fly-eye constituent lenses 28 in a surrounding manner in the form of a square ring. The first type fly-eye constituent lenses 26 are arranged around the second type fly-eye constituent lenses 27 in a surrounding manner.

According to the fly-eye lens device 25, three types of fly-eye constituent lenses 28, 27 and 26 of unequal size are disposed in this order from the center of the fly-eye lens 15 toward the periphery thereof. Therefore, uniform illumination can be achieved with higher accuracy in accordance with variation in the size of the aperture 9a of the stop 9.

In the respective preferred embodiments, the fly-eye lens 15 is formed with two or three types of fly-eye constituent lenses of unequal size. The fly-eye lens 15 may be formed with four or more types of fly-eye constituent lenses of unequal size. In such a case, these types of the constituent lenses are arranged in order of ascending size from the center of the fly-eye lens toward the periphery thereof.

In the respective preferred embodiments, the fly-eye constituent lenses 21, 22, 26, 27 and 28 are of square cross section. However, they may be of rectangular cross section. In this case, for the arrangement of plural types of fly-eye constituent lenses of unequal size in close contact with each other, the cross-sectional shapes thereof are required to be similar to each other.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A fly-eye lens device incorporated in a projection printing apparatus comprising:
    a fly-eye lens comprising a two-dimensional arrangement of plural types of fly-eye constituent lenses of unequal size; and
    supporting means for supporting said fly-eye lens,
    wherein the types of said fly-eye constituent lenses are disposed in order of ascending size from the center of said fly-eye lens toward the periphery thereof.

2. A fly-eye lens device as defined in claim 1, wherein said fly-eye lens comprises first fly-eye constituent lenses of square cross section and second fly-eye constituent lenses of square cross section, the side of the square cross section of said second fly-eye constituent lens being 1/n times as long as that of the square cross section of said first fly-eye constituent lens, where n is an integer larger than, and said second fly-eye constituent lenses are disposed in the center of said fly-eye lens in a square matrix while said first fly-eye constituent lenses are disposed around said second fly-eye constituent lenses in a surrounding manner.

3. A fly-eye lens device as defined in claim 1, wherein said fly-eye lens comprises first fly-eye constituent lenses of square cross section, second fly-eye constituent lenses of square cross section, the side of the square cross section of said second fly-eye constituent lens being ½ times as long as that of the square cross section of said first fly-eye constituent lens, and third fly-eye constituent lenses of square cross section, the side of the square cross section of said third fly-eye constituent lens being ¼ times as long as that of the square cross section of said first fly-eye constituent lens, and said third fly-eye constituent lenses are disposed in the center of said fly-eye lens in a square matrix, said second fly-eye constituent lenses being disposed around said third fly-eye constituent lenses in a surrounding manner in the form of a square ring, said first fly-eye constituent lenses being disposed around said second fly-eye constituent lenses in a surrounding manner.

4. The fly-eye lens of claim 1, wherein each fly-eye constituent lens is a bi-convex lens.

5. A lighting system for uniformly illuminating an object, comprising:
    a light source;
    a fly-eye lens device;

first optical means for introducing light emanating from said light source to said fly-eye lens device;

a stop disposed on a light-emission side of said fly-eye lens device; and second optical means for introducing light emanating from said fly-eye lens device and passing through said stop to said object, wherein said fly-eye lens device comprises a fly-eye lens comprising a two-dimensional arrangement of plural types of fly-eye constituent lenses of unequal size and supporting means for supporting said fly-eye lens, and the plural types of said fly-eye constituent lenses are disposed in order of ascending size from the center of said fly-eye lens toward the periphery thereof.

6. A lighting system as defined in claim 5, wherein said fly-eye lens comprises first fly-eye constituent lenses of square cross section and second fly-eye constituent lenses of square cross section, the side of the square cross section of said second fly-eye constituent lens being $1/n$ times as long as that of the square cross section of said first fly-eye constituent lens, wherein n is an integer larger than 1, and said second fly-eye constituent lenses are disposed in the center of said fly-eye lens in a square matrix while said first fly-eye constituent lenses are disposed around said second fly-eye constituent lenses in a surrounding manner.

7. A lighting system as defined in claim 5, wherein said fly-eye lens comprises first fly-eye constituent lenses of square cross section, second fly-eye constituent lenses of square cross section, the side of the square cross section of said second fly-eye constituent lens being $\frac{1}{2}$ times as long as that of the square cross section of said first fly-eye constituent lens, and third fly-eye constituent lenses of square cross section, the side of the square cross section of said third fly-eye constituent lens being $\frac{1}{4}$ times as long as that of the square cross section of said first fly-eye constituent lens, and said third fly-eye constituent lenses are disposed in the center of said fly-eye lens in a square matrix, said second fly-eye constituent lenses being disposed around said third fly-eye constituent lenses in a surrounding manner in the form of a square ring, said first fly-eye constituent lenses being disposed around said second fly-eye constituent lenses in a surrounding manner.

* * * * *